United States Patent
Nataraj

[19]

[11] Patent Number: 6,125,049
[45] Date of Patent: Sep. 26, 2000

[54] MATCH LINE CONTROL CIRCUIT FOR CONTENT ADDRESSABLE MEMORY

[75] Inventor: Bindiganavale S. Nataraj, Cupertino, Calif.

[73] Assignee: NetLogic Microsystems, Inc., Mountain View, Calif.

[21] Appl. No.: 09/225,919

[22] Filed: Jan. 5, 1999

[51] Int. Cl.[7] .................................................. G11C 15/00
[52] U.S. Cl. .................. 365/49; 365/189.07; 365/189.11
[58] Field of Search ........................ 365/49, 154, 189.07, 365/189.06, 203, 189.11

[56] References Cited

U.S. PATENT DOCUMENTS

| | | | |
|---|---|---|---|
| 4,523,301 | 6/1985 | Kadota et al. | 365/49 |
| 5,483,480 | 1/1996 | Yoneda | 364/49 |
| 5,740,097 | 4/1998 | Satoh | 365/49 |

Primary Examiner—A. Zarabian
Attorney, Agent, or Firm—William L. Paradice, III

[57] ABSTRACT

A match line control circuit includes a weak, static pull-up transistor and a strong, dynamic pull-up transistor coupled between a match line of an associated CAM and a supply voltage. Prior to compare operations, both the static pull-up transistor and the dynamic pull-up transistor are in a conductive state and thereby quickly charge the match line to the supply voltage. During compare operations, the dynamic transistor is turned off to reduce current flow between the supply voltage and the match line. In some embodiments, the static pull-up transistor and the dynamic pull-up transistor are configured to match the parasitics of the CAM cells 10 coupled to the match line, thereby increasing performance of the associated CAM.

8 Claims, 5 Drawing Sheets

MATCH LINE CONTROL CIRCUIT FOR CONTENT ADDRESSABLE MEMORY

BACKGROUND

1. Field of Invention

This invention relates generally to content addressable memories and specifically to improving the performance of content addressable memories.

2. Description of Related Art

Content addressable memories (CAM) are frequently used for Internet address searching. A conventional CAM 1 having n-bit words is shown in FIG. 1 to include a row of n CAM cells 10 coupled to an associated word line WL. Each CAM cell 10 includes a latch, formed by CMOS inverters 12 and 14, for storing a bit of data. Opposite sides of the latch are coupled to associated complementary bit lines BL and $\overline{BL}$ via pass transistors 16 and 18, respectively, where each transistor has a gate coupled to the associated word line WL. The output terminal of the inverter 12 is coupled to the gate of an NMOS pass transistor 20, and the output terminal of the inverter 14 is coupled to the gate of an NMOS transistor 22. The transistor 20 is coupled between the associated bit line BL and the gate of an NMOS pull-down transistor 24, and the transistor 22 is coupled between the associated complementary bit line $\overline{BL}$ and the gate of the pull-down transistor 24. The pull-down transistor 24 is coupled between ground potential and a match line ML associated with the CAM word formed by the cells 10 shown in FIG. 1. A PMOS pull-up transistor 26 is coupled between a supply voltage $V_{DD}$ and the match line ML. The pull-up transistor has a gate tied to ground potential and, therefore, remains in a conductive state. A conventional buffer 28 is coupled in series between the match line and an associated sensing circuit (not shown for simplicity).

During compare operations, the word line WL associated with the CAM word shown in FIG. 1 is grounded to turn off the pass transistors 16 and 18 associated with each CAM cell 10. Comparand bits C to be compared with the data bits Q stored in the CAM cells 10 are provided to the associated bit lines BL, and the respective complements of the comparand bit, herein denoted as $\overline{C}$, are provided to the associated complementary bit lines $\overline{BL}$. For each CAM cell 10, if the comparand bit C matches the data bit Q stored therein, the gate of the corresponding pull-down transistor 24 is driven with a logic low signal via transistors 20 or 22, thereby maintaining the pull-down transistor 24 in a non-conductive state. If, on the other hand, the comparand bit C does not match the data bit Q stored in the CAM cell 10, the gate of the corresponding pull-down transistor 24 is driven with a logic high signal via transistors 20 or 22, thereby turning on the pull-down transistor 24. When conductive, the pull-down transistors 24 pull the match line to ground potential.

Thus, if any of the comparand bits C do not match their corresponding data bits Q stored in the CAM cells 10, the match line ML will be pulled to a logic low state, i.e., ground potential. Conversely, if all of the comparand bits C match their corresponding data bits Q, the match line ML remains at the supply voltage $V_{DD}$, i.e., a logic high state. In response to the voltage level on the match line ML, the buffer 28 provides to an associated sense circuit (not shown for simplicity) an output signal indicative of whether all bits of the comparand word match all corresponding bits of the CAM word.

As mentioned above, if there is a mismatch between associated comparand C and data Q bits, the corresponding pull-down transistors 24 turn on and pull the match line ML to ground potential. When this mismatch condition occurs, both the PMOS pull-up transistor 26 and one or more of the pull-down transistors 24 are conductive, thereby forming a path from the supply voltage $V_{DD}$ to ground potential. This path to ground potential results in significant power dissipation. Further, this undesirable power dissipation increases as the size and/or density of the CAM 1 increases and, therefore, undesirably limits the memory size and the scalability of the CAM 1. Further, since the PMOS transistor 26 is necessarily a weak pull-up transistor so as to allow one or more of the pull-down transistors 24 to pull the match line ML to ground potential in response to a mismatch condition, the pull-up transistor 26 is slow in charging the match line ML to the supply voltage $V_{DD}$ between compare operations. This slow charging of the match line ML undesirably limits the speed of the CAM 1. Note that increasing the current-carrying capacity of the PMOS pull-up transistor 26 to increase the speed of the CAM 1 may prevent one of the NMOS pull-down transistors 24 from pulling the match line ML to ground potential and thereby results in erroneous match conditions. Further, the conducting pull-up transistor 26 works against the pull-down transistors 24 when discharging the match line ML and, therefore, undesirably slows CAM speed.

SUMMARY

A match line control circuit is disclosed which overcomes problems in the prior art mentioned above. In accordance with the present invention, a match line control circuit includes a weak, static pull-up transistor and a strong, dynamic pull-up transistor coupled between a match line of an associated CAM word and a supply voltage. Prior to compare operations, both the static pull-up transistor and the dynamic pull-up transistor are in a conductive state and thereby quickly charge the match line to the supply voltage. During compare operations, the dynamic transistor is turned off to reduce current flow between the supply voltage and the match line, thereby significantly reducing power dissipation during compare operations. In some embodiments, the static pull-up transistor and the dynamic pull-up transistor are configured to match the parasitics of CAM cells coupled to the match line, thereby increasing performance of the associated CAM.

BRIEF DESCRIPTION OF THE DRAWINGS

Like reference numerals refer to corresponding parts throughout the drawing figures.

DETAILED DESCRIPTION

Embodiments of the present invention are discussed below in the context of CAM cell 10 for simplicity only. It is to be understood that embodiments of the present invention are equally applicable to other content addressable memories employing any suitable CAM cells. Accordingly, the present invention is not to be construed as limited to specific examples described herein but rather includes within its scope all embodiments defined by the appended claims.

Figure 2:
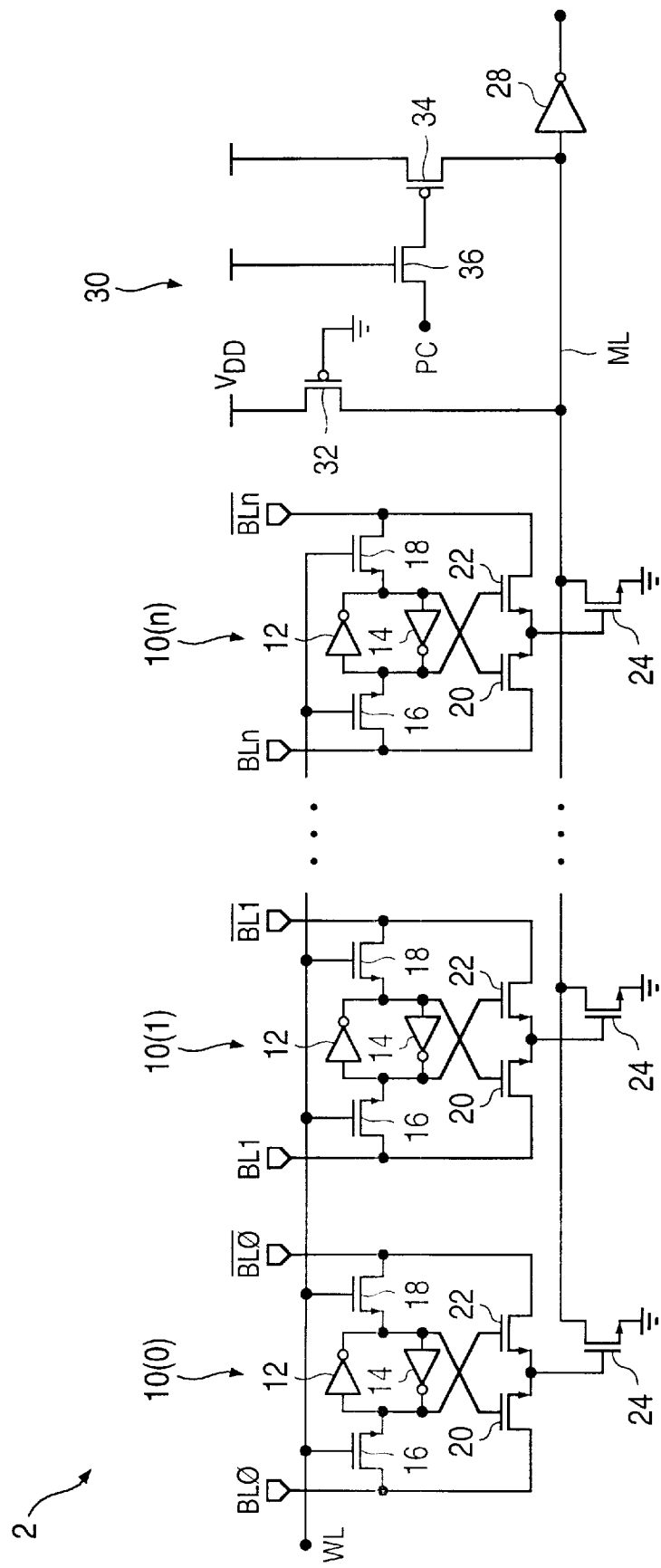
FIG. 2 is a circuit diagram of a CAM word and an associated match line control circuit in accordance with the present invention.

FIG. 2 shows one word of a CAM 2 employing conventional CAM cells 10 and a match line control circuit 30 in accordance with a preferred embodiment of the present invention. The circuit 30 includes a weak PMOS pull-up transistor 32 coupled between the supply voltage $V_{DD}$ and the match line ML of the CAM 2. The gate of the weak pull-up transistor 32 is tied to ground potential and thereby maintains the transistor 32 in a conductive state. A strong PMOS pull-up transistor 34 is coupled in parallel to the static pull-up transistor 32, and thereby provides an additional path between the supply voltage $V_{DD}$ and the match line ML. The gate of the strong pull-up transistor 34 is coupled to receive a pre-charge control signal PC via an associated NMOS pass transistor 36. The gate of the NMOS pass transistor 36 is coupled to the supply voltage $V_{DD}$ and thereby maintains the pass transistor 36 in a conductive state.

Figure 3:
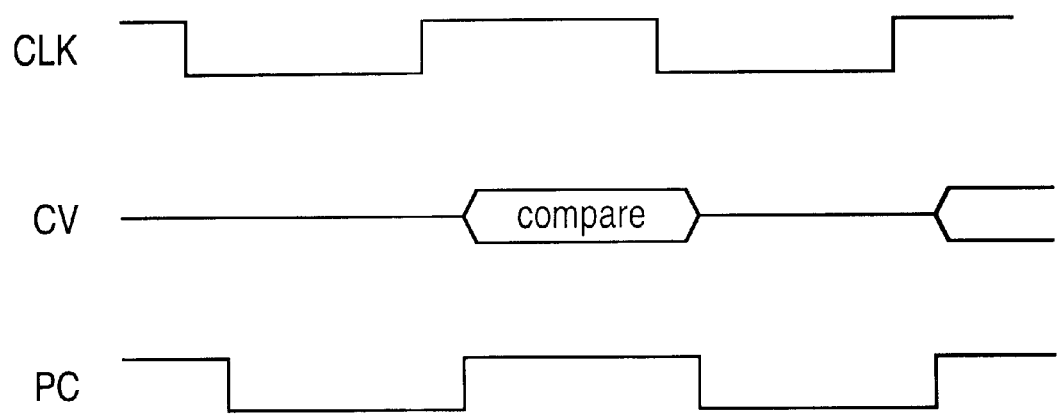
FIG. 3 is a timing diagram illustrating operation of the control circuit of FIG. 2.

Prior to a compare operation of a comparand word with a data word stored in the CAM cells 10 of the CAM 2, corresponding with the CAM clock signal CLK going low as shown in FIG. 3, the control signal PC is driven to a logic low state. In response thereto, the strong PMOS pull-up transistor 34 turns on and quickly charges the associated match line ML to the supply voltage $V_{DD}$. After the match line ML is suitably charged, the pre-charge control signal PC is driven to a logic high state so as turn off the pull-up transistor 34. Then, in response to well known control signals which enable a comparison between a comparand word and the data word stored in the CAM cells 10, the CAM pull-down transistors 24 become responsive to the results of the compare operation, as denoted by the compare valid CV waveform shown in FIG. 3. Here, if any of the bit comparisons between the comparand word and the data word stored in the CAM cells 10 results in a mismatch, the corresponding CAM pull-down transistor 24 will pull the match line ML to ground potential. Conversely, if all of the bit comparisons result in matches, all CAM pull-down transistors 24 remain in a non-conductive state, and thereby leave the match line ML in the logic high state.

Figure 1:
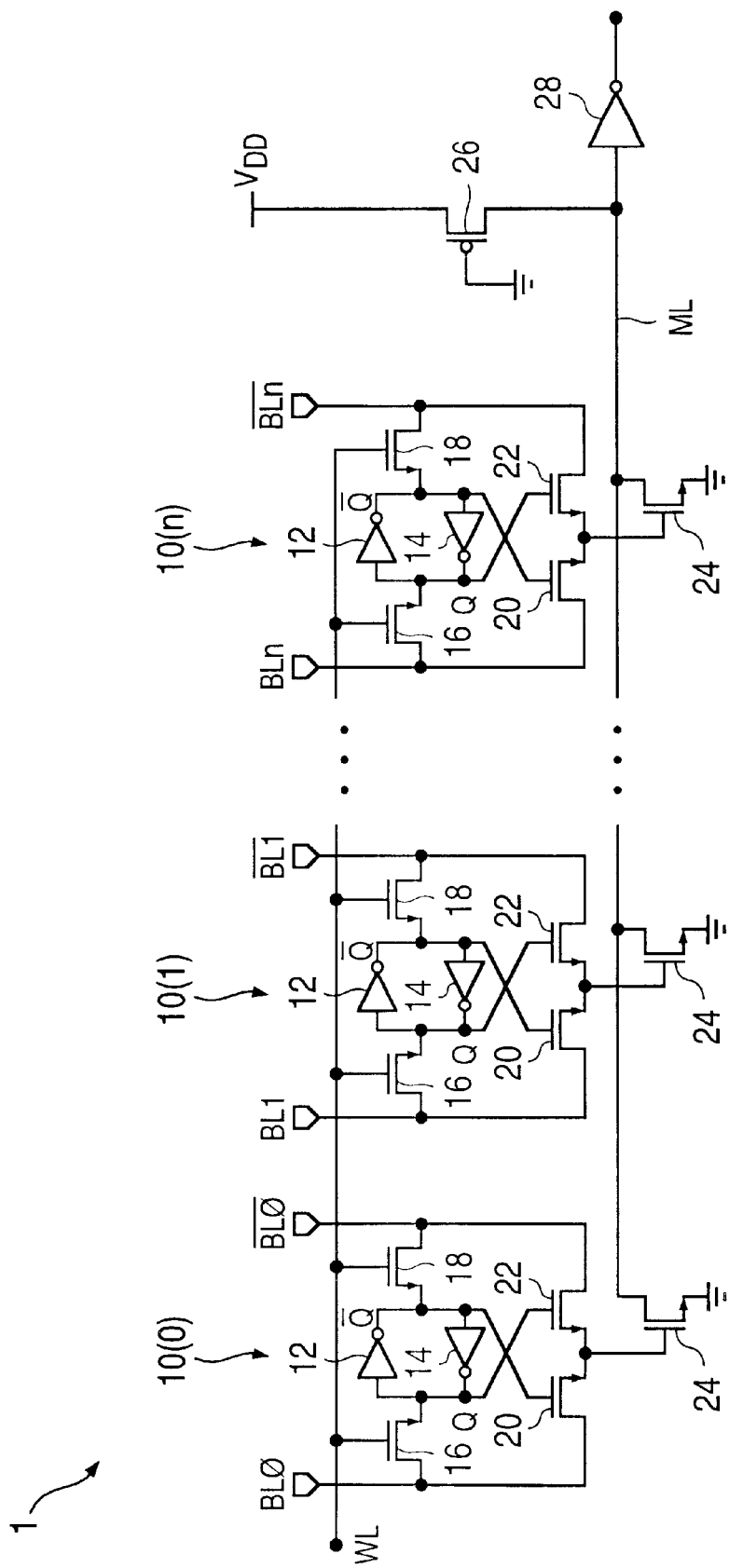
FIG. 1 is a circuit diagram of a CAM word coupled to a conventional match line control circuit.

The strong pull-up transistor 34 preferably has a much larger current-carrying capacity than does the weak pull-up transistor 32. In this manner, turning on the strong pull-up transistor 34 to pre-charge the match line ML significantly boosts the match line charging current and, therefore, increases the speed with which data stored in the associated CAM cells 10 may be compared to a comparand word. Further, by sourcing most of the match line charging current through the strong pull-up transistor 34, present embodiments allow the size and current carrying capacity of the static pull-up transistor 32 to be minimized. Minimizing the current carrying capacity of the static pull-up transistor 32, in turn, minimizes current flow from the supply voltage $V_{DD}$ to ground potential during mismatch conditions, thereby advantageously reducing power dissipation of the CAM 2. Further, unlike the prior art match line control circuit of FIG. 1, present embodiments allow current flow through the static pull-up transistor 32 to be suitably adjusted so as to maintain the match line ML in an acceptable logic high state when there is not a mismatch condition, thereby improving data reliability of the CAM 2.

Although the ratio of current carrying capacities of respective pull-up transistors 32 and 34 may be adjusted depending upon desired operating characteristics, as well as upon the size, type, and specific configuration of the CAM cells 10 and their associated array architecture, the ratio should be high enough to provide quick charging of the match line ML while minimizing power dissipation during mismatch conditions of compare operations. Note that while the pre-charge control signal PC may be de-asserted simultaneously with the CAM pull-down transistors 24 becoming responsive to bit comparisons, it is preferable that the pre-charge control signal PC is de-asserted slightly before the pull-down transistors 24 become responsive so as to avoid current paths to ground caused by inadvertent timing mismatches or delays. In some embodiments, the pre-charge signal PC is a sub-time signal having a pulse width independent of the clock signal CLK.

The circuit 30 shown in FIG. 2 is configured to mirror the pull-down transistor configurations coupled between the match line ML and each of the CAM cells 10. Here, the pass transistor 36 provides the pre-charge control signal PC to the gate of the strong pull-up transistor 34 in a manner similar to CAM pass transistors 20 and 22 providing a match signal to the gate of the CAM pull-down transistor 24. By modeling the pull-down transistor configuration of the CAM word, the circuit 30 is able to match the parasitics and RC loading of each CAM cell 10 coupled to associated match line ML and, therefore, the circuit 30 effectively tracks the timing delays within the CAM cells 10. This tracking function of the circuit 30 allows the above-mentioned delay between the pre-charge control signal PC being de-asserted and the CAM pull-down transistors 24 being responsive to compare operations to be minimized, thereby further improving speed of the associated CAM.

Figure 4:
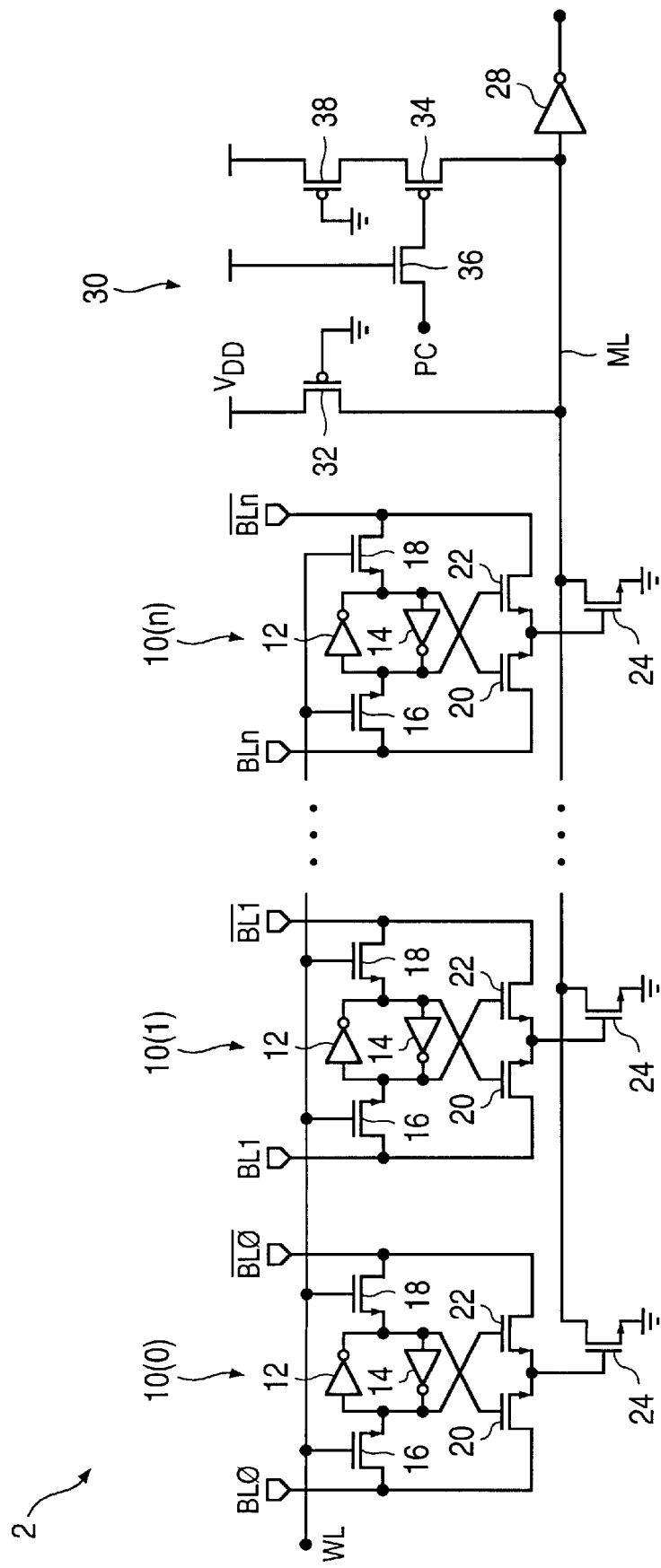
FIG. 4 is a circuit diagram of a CAM word and an associated match line control circuit in accordance with another embodiment of the present invention.
Figure 5:
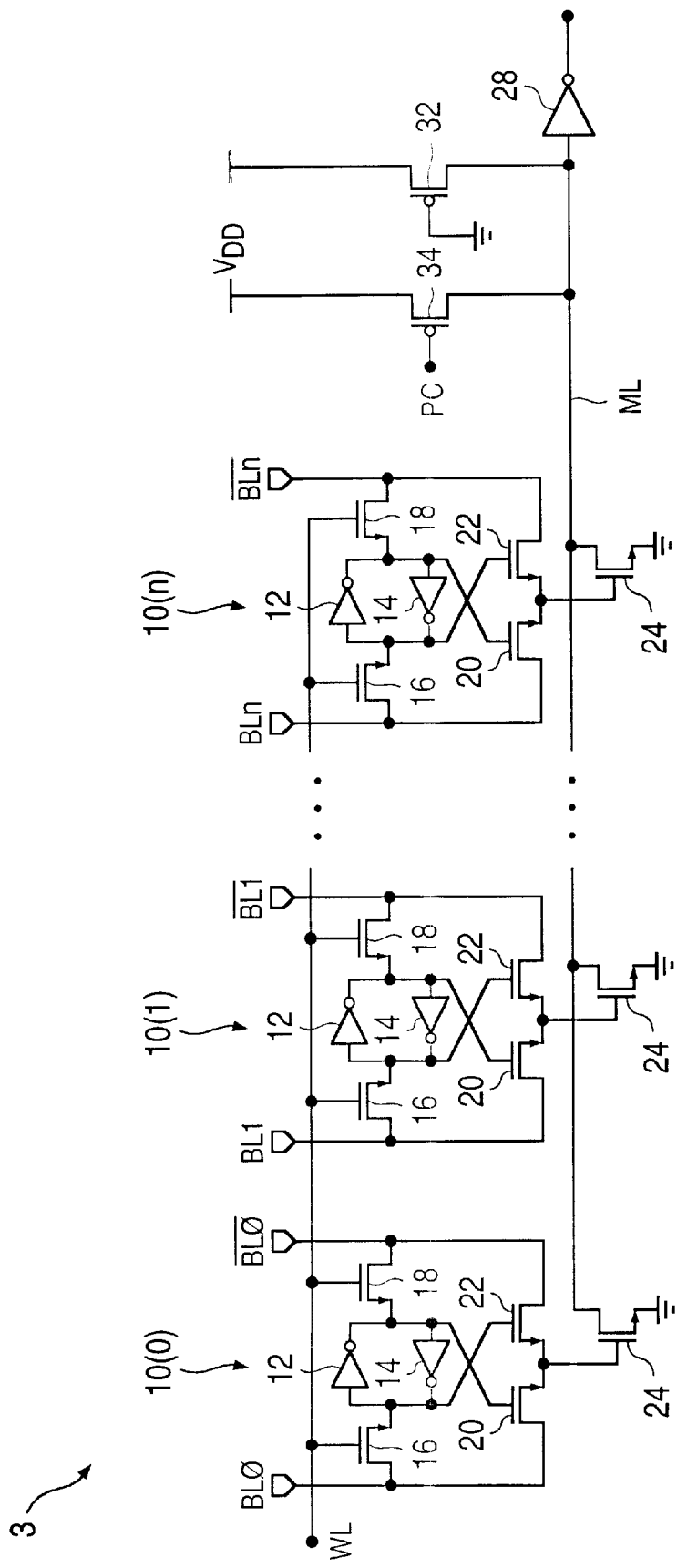
FIG. 5 is a circuit diagram of a CAM word and an associated match line control circuit in accordance with yet another embodiment of the present invention.

In some embodiments, the polarity of the transistors 32, 34, and/or 36 may be suitably reversed in a well known manner as may be required by specific applications. For instance, in one embodiment, the pull-up transistor 34 is an NMOS transistor having a gate coupled to receive a complement of the pre-charge signal PC illustrated in FIG. 3. In some embodiments, the gate of the pass transistor 36 is coupled to receive a complement of the pre-charge control signal PC rather than being tied to the supply voltage. Referring to FIG. 4, in one embodiment, a PMOS transistor 38 is coupled in series between the pull-up transistor 34 and the supply voltage $V_{DD}$ and includes a gate tied to ground potential. Here, the size of transistor 38 is adjusted to suitably limit current flow through the pull-up transistor 34. Where conserving silicon area is of greater importance than matching parasitics of the CAM cells, the pass transistor 36 may be eliminated, as shown, for instance, in FIG. 5.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A control circuit coupled to an associated match line of a content addressable memory having a row of memory cells, each memory cell having one or more pass transistors cupled between the memory cell and a gate of an associated pull-down transistor coupled between the match line and ground potential, wherein during a compare operation the pull-down transistor pulls the match line to ground potential in response to a mismatch condition between a data bit stored in the memory cell and a comparand bit, the control circuit comprising:

a weak pull-up transistor coupled between the match line and a supply voltage and having a gate tied to a predetermined potential so as to maintain the weak pull-up transistor in a conductive state, the weak pull-up transistor thereby slowly charging the match line prior to and during the compare operation; and a strong pull-up transistor coupled between the match line and the supply voltage and having a gate coupled to receive a pre-charge control signal, wherein prior to the compare operation the pre-charge control signal is in a first logic stateso that the strong pull-up transistor conducts and rapidly charges the match line, and wherein during the compare operation the pre-charge control signal is in a second logic state so that the strong pull-up transistor is non-conductive and thereby substantially reduces current flow between the supply voltage and ground potential during the mismatch condition.

2. The control circuit of claim 1, wherein the predetermined potential comprises ground potential.

3. The control circuit of claim 1, wherein the strong pull-up transistor and the weak pull-up transistor comprise PMOS transistors.

4. The control circuit of claim 1, wherein the pre-charge control signal turns off the strong pull-up transistor in response to commencement of the compare operation.

5. The control circuit of claim 1, further comprising a pass transistor having a first terminal coupled to the gate of the strong pull-up transistor, a second terminal coupled to receive the pre-charge control signal, and a gate coupled to the supply voltage, the pass transistor modeling the one or more pass transistors coupled between the memory cell and the gate of the pull-down transistor.

6. The control circuit of claim 5, wherein the pass transistor comprises an NMOS transistor.

7. The control circuit of claim 5, further comprising a second pass transistor coupled between the strong pull-up transistor and the voltage supply, the second pass transistor limiting current flow of the strong pull-up transistor.

8. The control circuit of claim 7, wherein the second pass transistor comprises a PMOS transistor and has a gate tied to ground potential.

* * * * *

UNITED STATES PATENT AND TRADEMARK OFFICE
CERTIFICATE OF CORRECTION

PATENT NO   :   6,125,049
DATED       :   Sept. 26, 2000
INVENTOR(S) :   Nataraj It is certified that error appears in the above-identified patent and that said Letters Patent are hereby corrected as shown below:

Col. 4, line 61, replace "cupled" with --coupled--.

Col. 5, line 11, replace "stateso" with --state so--.

Signed and Sealed this

Twenty-fourth Day of April, 2001

Attest:

NICHOLAS P. GODICI

Attesting Officer    Acting Director of the United States Patent and Trademark Office